United States Patent
Dispenza et al.

(10) Patent No.: US 11,397,234 B2
(45) Date of Patent: Jul. 26, 2022

(54) METHOD AND SYSTEM FOR ACCELERATED WAVE DATA MAGNETIC RESONANCE ACQUISITION

(71) Applicant: Siemens Healthcare GmbH, Erlangen (DE)

(72) Inventors: Nadine Dispenza, Erlangen (DE); Dominik Paul, Bubenreuth (DE); Manuel Stich, Parkstein (DE); Mario Zeller, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 17/149,073

(22) Filed: Jan. 14, 2021

(65) Prior Publication Data

US 2021/0223344 A1 Jul. 22, 2021

(30) Foreign Application Priority Data

Jan. 16, 2020 (EP) .................................. 20152184

(51) Int. Cl.
*G01V 3/00* (2006.01)
*G01R 33/561* (2006.01)
*G01R 33/48* (2006.01)
*G01R 33/54* (2006.01)

(52) U.S. Cl.
CPC ....... *G01R 33/561* (2013.01); *G01R 33/4822* (2013.01); *G01R 33/543* (2013.01)

(58) Field of Classification Search
CPC .............. G01R 33/3415; G01R 33/543; G01R 33/5659; G01R 33/36; A61B 5/055

USPC .......................................................... 324/309
See application file for complete search history.

(56) References Cited

U.S. PATENT DOCUMENTS

| 9,953,439 | B2 | 4/2018 | Salerno et al. |
| 2006/0226836 | A1* | 10/2006 | Shu .................. G01R 33/56509 324/309 |
| 2018/0092569 | A1* | 4/2018 | Li ........................ G01R 33/482 |
| 2018/0271400 | A1* | 9/2018 | Forman .............. G01R 33/4822 |

OTHER PUBLICATIONS

Berkin Bilgic et al: "Wave-CAIPI for Highly Accelerated 3D Imaging", Magnetic Resonance in Medicine., vol. 73, No. 6, pp. 2152-2162; DOI: 10.1002/mrm.25347; (Jul. 1, 2014).
European Search Report dated Jul. 15, 2020, Application No. 20152184.6.

* cited by examiner

*Primary Examiner* — Walter L Lindsay, Jr.
*Assistant Examiner* — Frederick Wenderoth
(74) *Attorney, Agent, or Firm* — Banner & Witcoff Ltd.

(57) ABSTRACT

In a method for generating at least one MR image of an object in an MR system comprising a plurality of signal receiving coils, a sequence of RF pulses are applied in order to generate a plurality of MR signal echoes, the MR signal-echoes are detected with the plurality of signal receiving coils in a 3-dimension-al k-space, and the at least one MR image is reconstructed using the non-homogeneous under sampled 3-dimensional k-space based on a compressed sensing technology. The 3-dimensional k-space may be undersampled with a plurality of constant radii corkscrew trajectories having different radii resulting in a non-homogeneous undersampled 3-dimensional k-space.

13 Claims, 6 Drawing Sheets

METHOD AND SYSTEM FOR ACCELERATED WAVE DATA MAGNETIC RESONANCE ACQUISITION

CROSS REFERENCE TO RELATED APPLICATIONS

This patent application claims priority to European Patent Application No. 20152184.6, filed Jan. 16, 2020, which is incorporated herein by reference in its entirety.

BACKGROUND

Field

The present disclosure relates to a method for generating at least one magnetic resonance (MR) image, to an MR system configured to generate the at least one MR image, to a computer program and a carrier.

Related Art

To accelerate magnetic resonance (MR) measurements, it is known to use undersampling schemes when acquiring the MR signals in k-space. Here, depending on the acceleration factor of the undersampling scheme, data samples are only taken for every second or third k-space position. Then a reconstruction of the undersampled MR data set can be implemented to obtain a reconstructed MR data set, the MR image.

In this context, an image acquisition method called CAIPIRINHA is known. Furthermore, a method known as WAVE-CAIPI was introduced by Bilgic B. et al., as described in "WAVE-CAIPI for highly accelerated 3D imaging" Magnetic Resonance Imaging 73(6) 2015:2152-2162.

If the acceleration factor is too high the reconstructed magnetic resonance image (MRI) data set can show artefacts and/or noise.

WAVE-CAIPI applies identical oscillating readouts on one of the two axes perpendicular to the read-out direction which creates constant radii corkscrew trajectories through k-space for each acquired line. Accelerating scan times by increasing undersampling of WAVE-CAIPI acquisitions results in poor images with high g-factors. To avoid artefacts resulting in poor image quality, undersampling is normally limited to less than 3×3.

Furthermore, the patient as object under examination hears an unpleasant high-pitched sound of approximately constant 100 dB in view of the occurring gradient switching.

BRIEF DESCRIPTION OF THE DRAWINGS/FIGURES

The accompanying drawings, which are incorporated herein and form a part of the specification, illustrate the embodiments of the present disclosure and, together with the description, further serve to explain the principles of the embodiments and to enable a person skilled in the pertinent art to make and use the embodiments.

Figure 1:
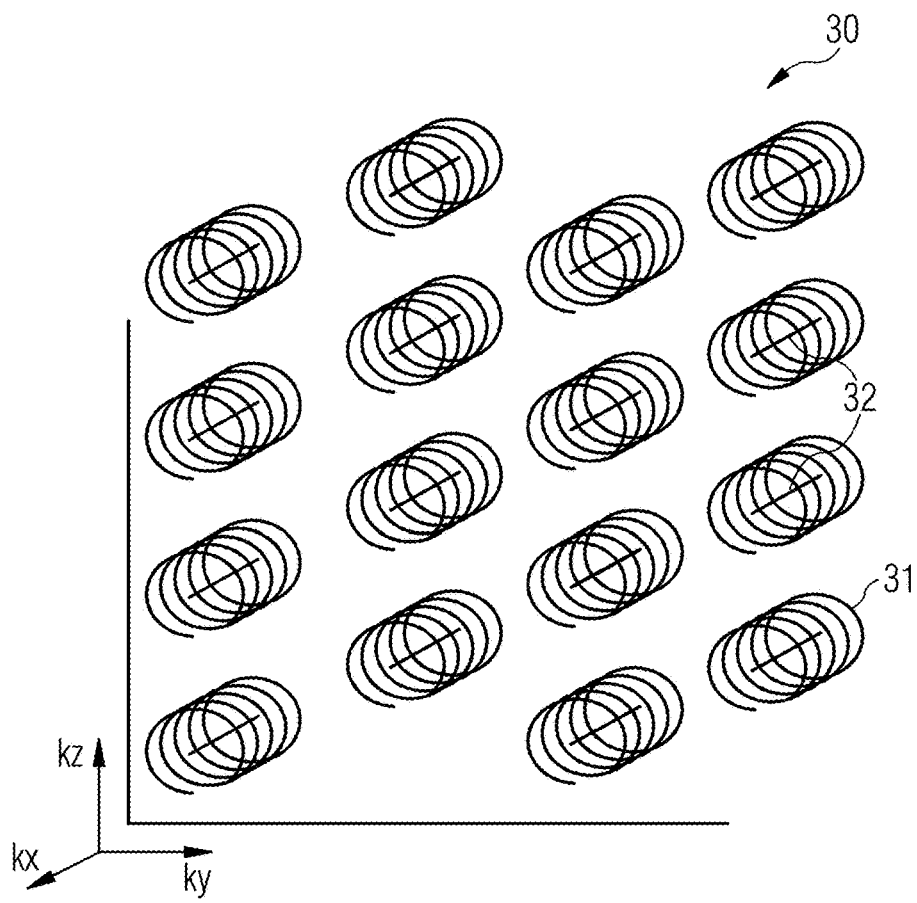
FIG. 1 shows a schematic view of an example acquisition of a k-space with constant radii corkscrew trajectories.

The exemplary embodiments of the present disclosure will be described with reference to the accompanying drawings. Elements, features and components that are identical, functionally identical and have the same effect are—insofar as is not stated otherwise—respectively provided with the same reference character.

DETAILED DESCRIPTION

In the following description, numerous specific details are set forth in order to provide a thorough understanding of the embodiments of the present disclosure. However, it will be apparent to those skilled in the art that the embodiments, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring embodiments of the disclosure. The connections shown in the figures between functional units or other elements can also be implemented as indirect connections, wherein a connection can be wireless or wired. Functional units can be implemented as hardware, software or a combination of hardware and software.

It is an object to avoid the above-mentioned drawbacks and to provide a method and a system allowing high undersampling factors with less artefacts while lowering the acoustic noise generated during the image acquisition.

According to a first aspect, a method for generating at least one MR image of an object under examination is provided in an MR system wherein the MR system comprises a plurality of signal receiving coils. According to the method, a sequence of radiofrequency, RF, pulses is applied in order to generate a plurality of MR signal echoes. These signal echoes are detected with a plurality of receiving coils in a 3 dimensional k-space, wherein the 3 dimensional k-space is undersampled with a plurality of constant radii corkscrew trajectories. The plurality of constant radii corkscrew trajectories have different radii resulting in a non-homogeneous undersampled 3 dimensional k-space. The at least one MR image is reconstructed using the non-homogeneous undersampled 3 dimensional k-space using a compressed sensing technology.

With the use of the different radii for the constant radii corkscrew trajectories, the inhomogeneity of the acquired k-space is further increased. This feature in connection with the compressed sensing technology used for reconstructing MR images leads to a reduced acquisition time compared to conventional WAVE-CAIPI imaging methods. With the use of the compressed sensing technology the image artefacts can be further reduced. Furthermore, due to the different radii the frequency and the amplitude of the involved gradients generate a more pleasant sound than the WAVE-CAIPI methods known in the art.

Preferably, the radii of the plurality of constant radii corkscrew trajectories increase with an increasing distance from a center of the non-homogeneous undersampled 3 dimensional k-space. The radius of a constant radii corkscrew trajectory close to the center of the k-space is smaller compared to regions further away from the center, so that the sampling density is higher close to the center. Accordingly, a higher image quality can be obtained.

Preferably, the MR signal echoes of each of the constant radii corkscrew trajectories are detected in a first data sampling period which is the same for all of the plurality of constant radii corkscrew trajectories. This can mean that the data acquisition window has the same lengths for all the constant radii corkscrew trajectories.

When the data sampling period is the same for all constant radii corkscrew trajectories it is possible that a sampling period with which the MR signal echoes are sampled within the first sampling rate is larger for a first constant radii corkscrew trajectory of the plurality of constant radii corkscrew trajectories having a larger radius compared to the sampling rate with which the MR signal echoes are sampled within the first sampling period for a second constant radii corkscrew trajectory of the plurality of constant radii corkscrew trajectories having a smaller radius than the first constant radii corkscrew trajectory.

In this example the sampling period is increased in order to keep the number of turns of the constant radii corkscrew trajectories fixed for the different radii.

Furthermore, it is possible that the sampling rate with which the MR signal echoes are sampled within the first data sampling period is the same for all of the plurality of constant radii corkscrew trajectories. Here, a number of turns is smaller for a first constant radii corkscrew trajectory of the plurality of constant radii corkscrew trajectories having a larger radius compared to the number of turns for a second constant radii corkscrew trajectory of the plurality of constant radii corkscrew trajectories having a smaller radius than the first constant radii corkscrew trajectory.

In this example, the sampling rate is kept constant, but the number of turns of the constant radii corkscrew trajectory decreases with increasing radius.

The non-homogeneous undersampled 3 dimensional k-space is a k-space which is not fully sampled under the Nyquist theorem.

Furthermore, the corresponding MR system is provided comprising an RF controller configured to apply a sequence of RF pulses in order to generate a plurality of MR signal-echoes. The MR system furthermore comprises a gradient controller configured to generate magnetic field gradients, and a plurality of signal receiving coils configured to detect the MR signal-echoes. An image sequence controller is configured to control the application of RF pulses, magnetic field gradients and the detection of the MR signal-echoes in the 3 dimensional k-space such that the 3 dimensional k-space is undersampled with a plurality of constant radii corkscrew trajectories wherein the plurality of constant radii corkscrew trajectories have different radii resulting in a non-homogeneous undersampled 3 dimensional k-space. A processor is configured to reconstruct the at least one MR image using the non-homogeneous undersampled 3 dimensional k-space and using a compressed sensing technology.

The MR system is configured to operate as discussed above or as discussed in further detail below.

Additionally, a computer program comprising program code is provided which, when executed by an MR system, causes the MR system to perform a method as discussed above or as discussed in further detail below.

Furthermore, a carrier comprising the program is provided wherein the carrier is one of an electronic signal, optical signal, radio signal, or computer readable storage medium.

It should be understood that the features mentioned above and features yet to be explained below can be used not only in the respective combinations indicated, but also in other combinations or in isolation without departing from the scope of the present disclosure. Features of the above-mentioned aspects and embodiments described below may be combined with each other in other combinations unless explicitly mentioned otherwise.

FIG. 1 shows a schematic view of a conventional acquisition scheme of a k-space in which the k-space is a 3 dimensional k-space which is sampled by different constant radii corkscrew trajectories. The k-space 30 is sampled by a plurality of constant radii corkscrew trajectories 31, wherein each constant radii corkscrew trajectory has a central axis 32. The central axes 32 are parallel to one another and the same radius is used for each of the constant radii corkscrew trajectories. The image acquisition is in the Kx direction, the phase encoding directions are Ky, Kz.

Figure 2:
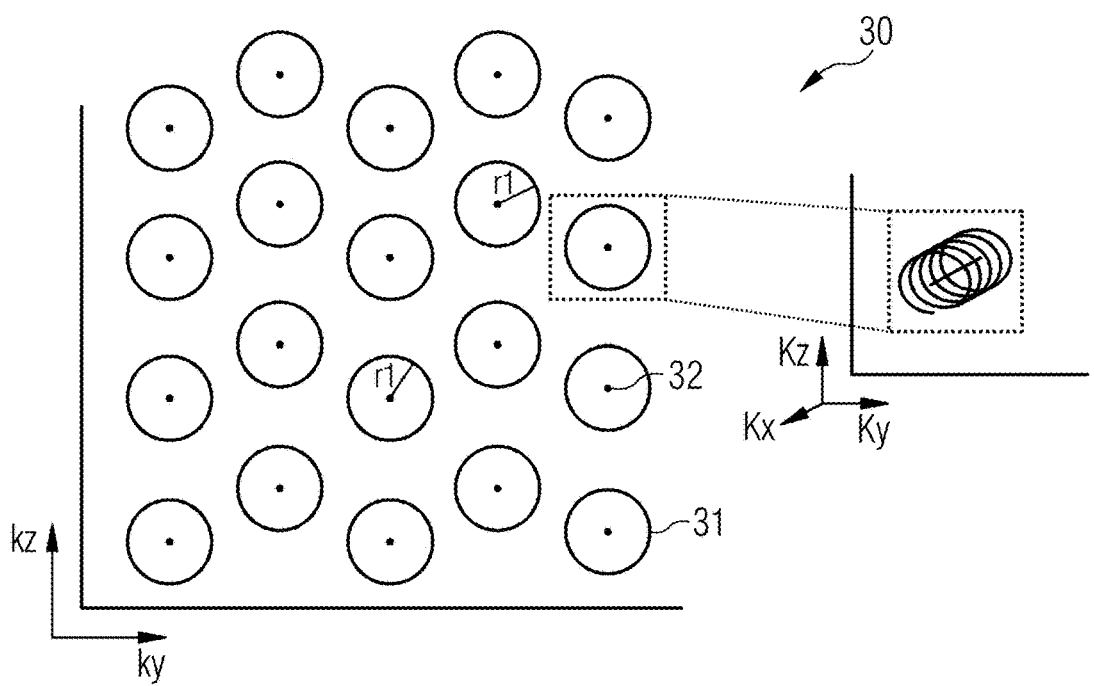
FIG. 2 is a schematic 2 dimensional top view of the acquisition as shown in FIG. 1.

FIG. 2 is a schematic 2 dimensional top view of the acquisition scheme of FIG. 1 with the different constant radii corkscrew trajectories 31. As can be seen from FIG. 2 all constant radii corkscrew trajectories have the same radius r1.

Figure 3:
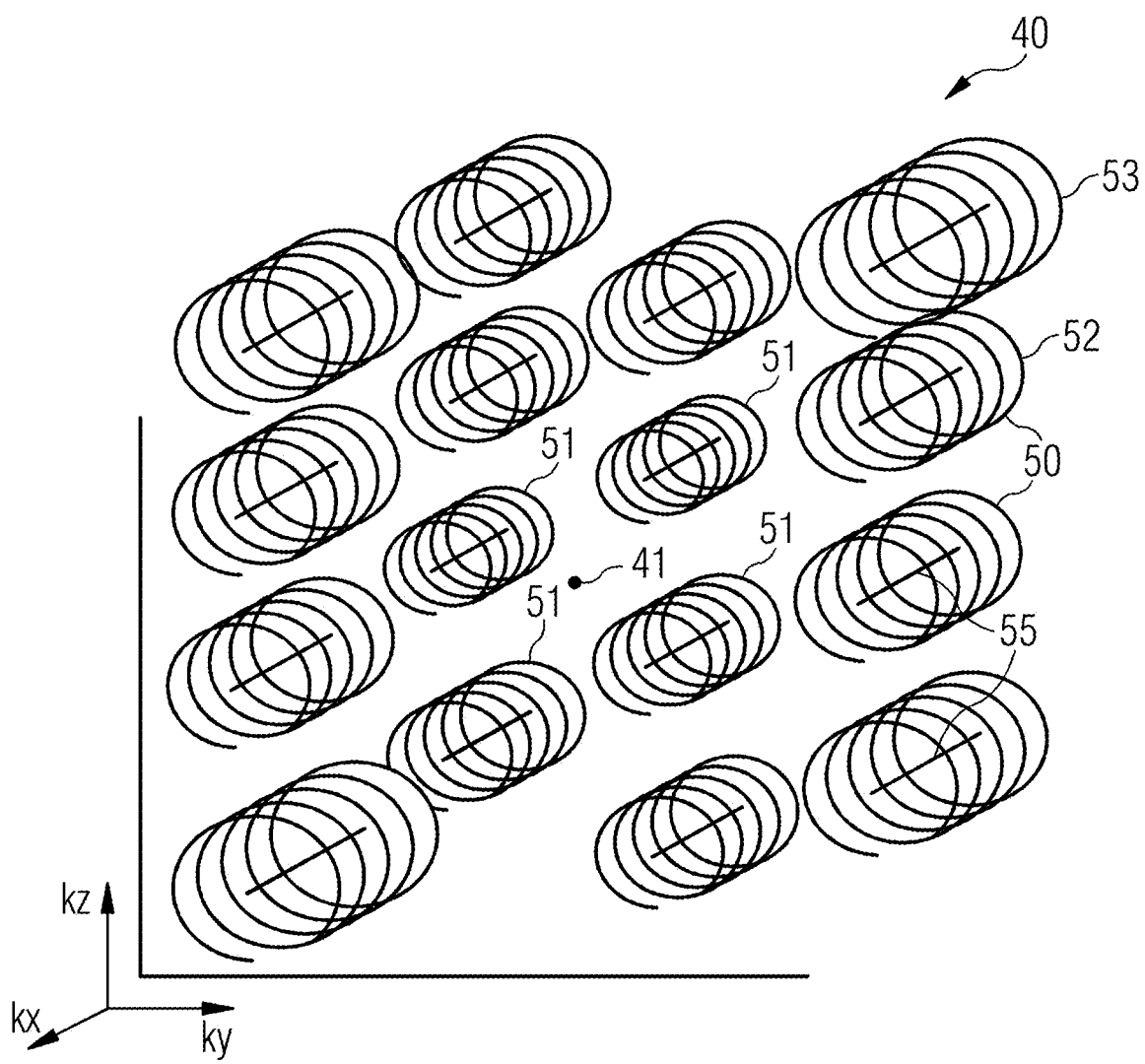
FIG. 3 shows a schematic view of an acquisition of a 3 dimensional k-space with different radii according to an exemplary embodiment of the disclosure.
Figure 4:
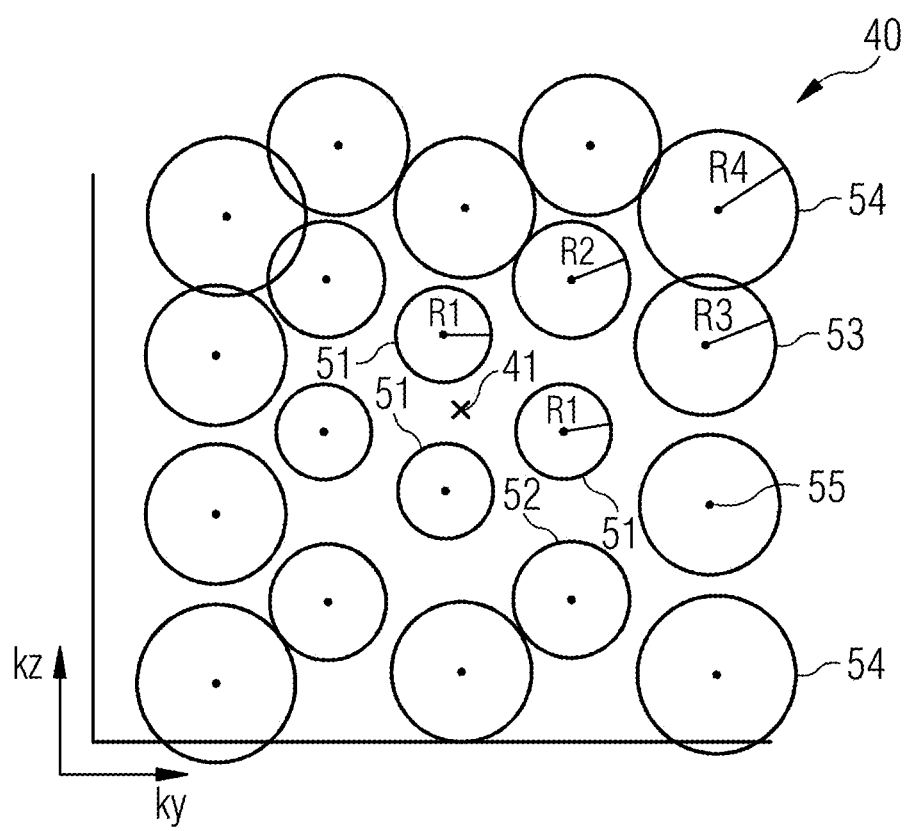
FIG. 4 shows a schematic 2 dimensional top view of the acquisition of FIG. 3.

FIG. 3 now shows an embodiment where the 3 dimensional k-space 40 is undersampled using trajectories 50 having different radii. A center of the k-space 41 is located in the middle of the space defined by the axes Kz and Ky and is located in the middle of the extension of the k-space in the Kx direction. The different turns 50 are now designed such that constant radii corkscrew trajectories such as trajectories 51 have a smaller radius compared to trajectories 52 or 53. Making also reference to FIG. 4 the trajectories around the center of k-space 41 have the smallest radius R1 wherein constant radii corkscrew trajectories 52 located further away have a larger radius R2 and constant radii corkscrew trajectories 53 have a radius R3. The constant radii corkscrew trajectories 54 having the greatest distance to the center 41 have the largest radius R4. It should be understood that a different distribution of the different radii is possible, but preferably the sampling density is higher in the space close to the k-space center meaning a smaller radius. The image acquisition is such that the different constant radii corkscrew trajectories are acquired consecutively. The gradients in the Kz and Ky directions are switched to a first point of the constant radii corkscrew trajectory and then the constant radii corkscrew trajectory is followed by switching on the read-out gradient in the Kx direction and by switching the gradients in the Ky, Kz direction in order to have a circular pattern in this plane. The central axis 55 of the different constant radii corkscrew trajectories are preferably parallel to one another.

It is possible to use the same duration of the data sampling period for all of the constant radii corkscrew trajectories. As the path of one constant radii corkscrew trajectory having a larger radius is longer compared to a constant radii corkscrew trajectory having a smaller radius two possible options exist. The first option is to increase the data sampling rate for the trajectories having a larger radius in order to keep the number of turns of the constant radii corkscrew trajectory fixed. The other option is to keep the sampling rate constant so that a smaller number of turns are present in a constant radii corkscrew trajectory having a larger diameter compared to a constant radii corkscrew trajectory having a smaller diameter.

Figure 5:
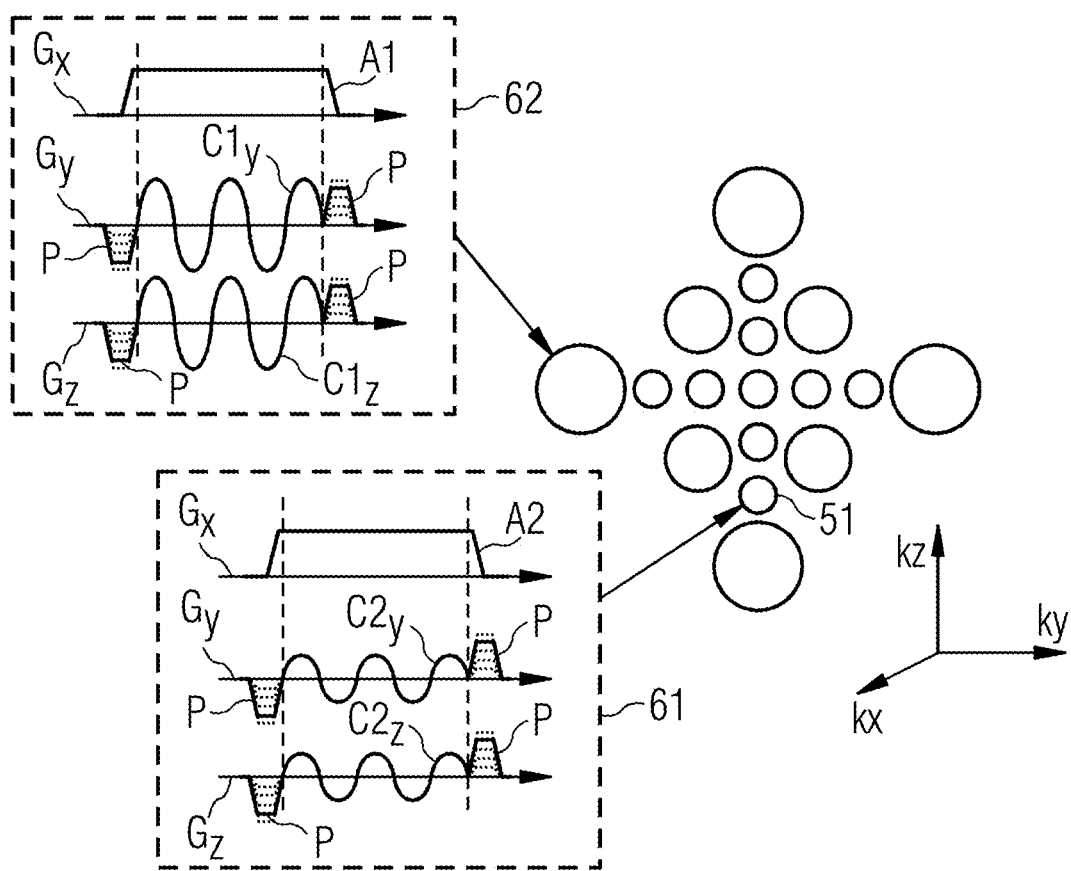
FIG. 5 shows a schematic view of a gradient switching used to generate the constant radii corkscrew trajectories having different radii according to an exemplary embodiment of the disclosure.

FIG. 5 shows a schematic explanation of the gradient switching how to obtain the different constant radii corkscrew trajectories of a varying size. For the constant radii corkscrew trajectory 51 the gradient switching 61 is shown, for the trajectory 52 the switching 62. The gradient in the X direction A1, A2 is the read-out gradient which may be constant or variable in size. In addition to the read-out gradient the phase encoding gradients C1Y, C1Z and C2Y and C2Z are applied. The gradients C1Y and C1Z have the same amplitude and the gradients C2Y and C2Z have the same higher amplitude. With this sinusoidal shape of the gradients in the Gy and Gz direction a k-space sampling is obtained which is indicated here as a circle. The additional phase encoding gradients P as shown for the gradient switching 60 and 62 shift the read-out at a certain position in k-space which is then the center of the read-out. As can be seen by varying the amplitudes with a smaller amplitude for the acquisition 61 the different radii can be obtained.

Figure 6:
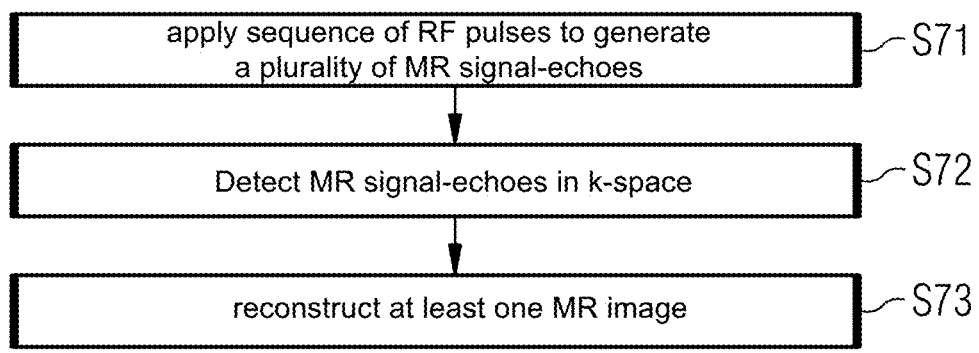
FIG. 6 shows a flowchart of a method carried out to generate an MR image using constant radii corkscrew trajectories of different radii and a compressed sensing technology according to an exemplary embodiment of the disclosure.

FIG. 6 summarizes some of the steps for the generation of the MR image discussed above. In step S71 a sequence of RF pulses is applied in order to generate a plurality of MR signal-echoes, wherein the signal acquisition schemas can include Cartesian or non-Cartesian sequences. In step S72 the MR signal-echoes are detected in a non-homogenous undersampled 3 dimensional k-space in which the different constant radii corkscrew trajectories are used having different radii. In step S73 the at least one MR image is reconstructed using this non-homogenous undersampled 3 dimensional k-space and using the compressed sensing technology. The way how the image reconstruction is known to the skilled person and comprises several data transformations and iterative optimization steps repeated several times. After the collection of the k-space data as discussed above an image may be generated with a Fourier transform and a Sparsifying transform may be applied to this image. After removing an aliasing artefacts an inverse Sparsifying and Fourier transform may be applied so that a (k-space) difference matrix can be created by subtracting the original from the denoised k-space data. With the Fourier transform a difference image can be created. By comparing the initial and the updated images it can be determined whether the optimization algorithm is repeated with the application of the Sparsifying transform such as a wavelet decomposition.

Figure 7:
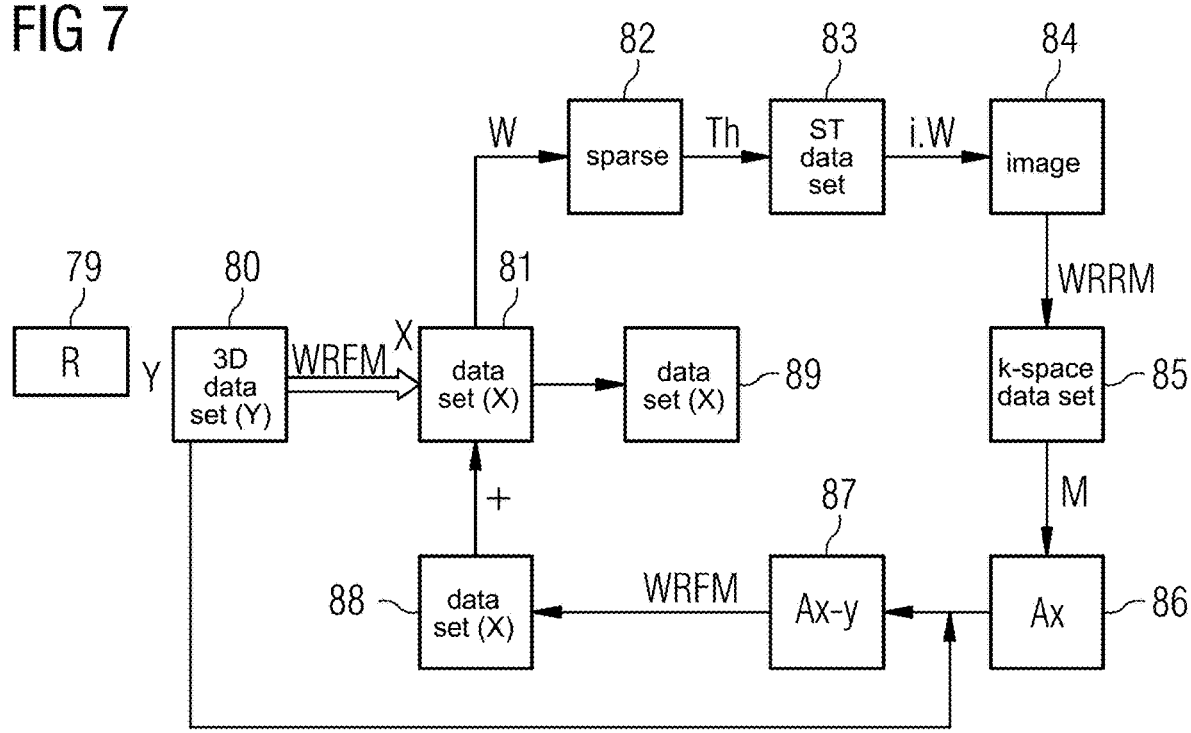
FIG. 7 shows a flowchart of a method used to reconstruct the image based on a non-homogenously undersampled 3 dimensional k-space with constant radii corkscrew trajectories of different radii according to an exemplary embodiment of the disclosure.
Figure 8:
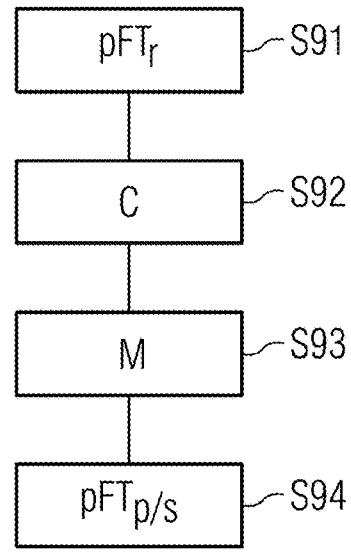
FIG. 8 shows a more detailed flowchart for a portion of the steps carried out in the method of FIG. 7, according to an exemplary embodiment of the disclosure.

FIG. 7 shows a schematic view of the reconstruction. Data set y 80 represents the acquired 3 dimensional MR data set as discussed above. In addition, data of a reference scan 79 is provided providing the coil sensitivities. The acquired data set is subject to a Wave Reconstruction Forward Model, WRFM, which is detailed in FIG. 8 wherein a partial Fourier transform is carried out in the read direction in step S91. In step S92 the echoes from the different coils are combined and in step S93 the result is modulated with the Point-Spread-Function in the phase encoding direction for the constant radii corkscrew trajectory i, with i being each unique constant radii corkscrew trajectory i.e. a specific amplitude or frequency combination. In step S93 a modulation is carried out with a Point-Speed-F function in the slice direction and in step S94 the partial Fourier transform is carried out in the phase coding and slice encoding direction. After the steps S91 to S94 data set 81 is obtained. Then an iterative reconstruction is carried out with an optimization process as discussed below. Data set 81 is then undergoing the sparsity transformation wherein W transforms the image space into the W-space. In the optimization procedure a solution then has to be found for the minimization that fulfills data consistency and transform sparsity. Accordingly a sparse representation 82 of the image is provided after the transform. The goal of this transformation is to locally separate the wanted signal from the noise artefacts. The W-space is a better suited depiction of the image as the sparsity in the W-space is higher. This means that the image information is concentrated in a few pixels in the W-space while most of the other pixels only have a very low signal intensity. Different options exist for this W transform, one possible solution being a wavelet transformation.

Figure 9:
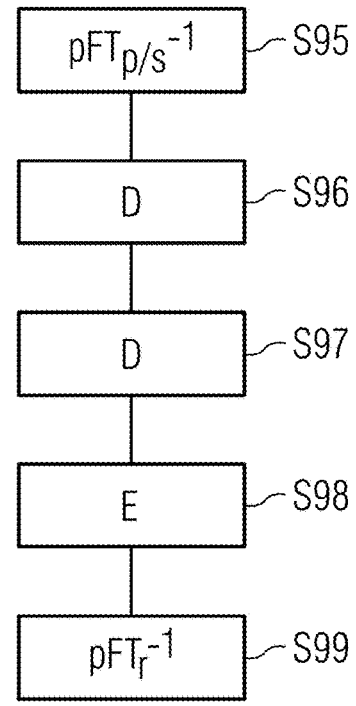
FIG. 9 shows a more detailed flowchart for a portion of the steps carried out in the method of FIG. 7, according to an exemplary embodiment of the disclosure.

After the W transformation that wanted signal is now to a high degree separated from the noisy parts. This allows the removal of the noise by a thresholding procedure in which all the pixels having a value smaller than a threshold are set to zero and in which the threshold is subtracted from all the other pixel values so that a data set 83 is generated. This is also called soft thresholding. As many pixels in the W-space now have the value of zero, the number of non-zero pixels is lower. 83 then undergoes the inverse W transform so that image 84 is obtained. To this image 84 the Wave Reconstruction Reverse Model, WRRM, is applied which is explained in further detail in FIG. 9. In FIG. 9 a partial inverse Fourier transform is carried out in the phase and slice encoding direction step S95. In step S96 the result is demodulated with the Point-Spread-Function in the phase encoding direction and the corresponding constant radii corkscrew trajectory i. In step S97 the demodulation is carried out with the Point-Spread-Function in the slice encoding direction and the corresponding constant radii corkscrew trajectory i and in step S98 the echoes are extracted from each coil so that in step S99 the partial inverse Fourier transform is carried out in the readout direction.

The result is image 85. Then a masking is carried out so that the k-space data set 85 is fitted such that only the points of k-space that were also measured in the data set 80 remain. The rest of the k-space is set to zero. After the masking with the measured trajectory the trajectory k-space A·x is obtained in the data set 86. x is the estimated image and A is the transformation. In the following the difference in k-space is created by subtracting the k-space Ax from the measured k-space y so that a difference Ax−y is obtained which corresponds to the error, the non-consistency that this threshold used above has created. This difference is a correction k-space data set 87. To reconstruct data set 87 again the wave reconstruction forward model is applied as discussed above in FIG. 8. Accordingly a difference image 88 is obtained and this updated image now has less noise-like artefacts than the image before the update. This process can now be repeated until either a least square difference of the data consistency term is smaller than a threshold or a predefined number of iterations has been reached.

If the threshold is smaller than a difference or if a final number of iterations was made the final image 89 is obtained.

Figure 10:
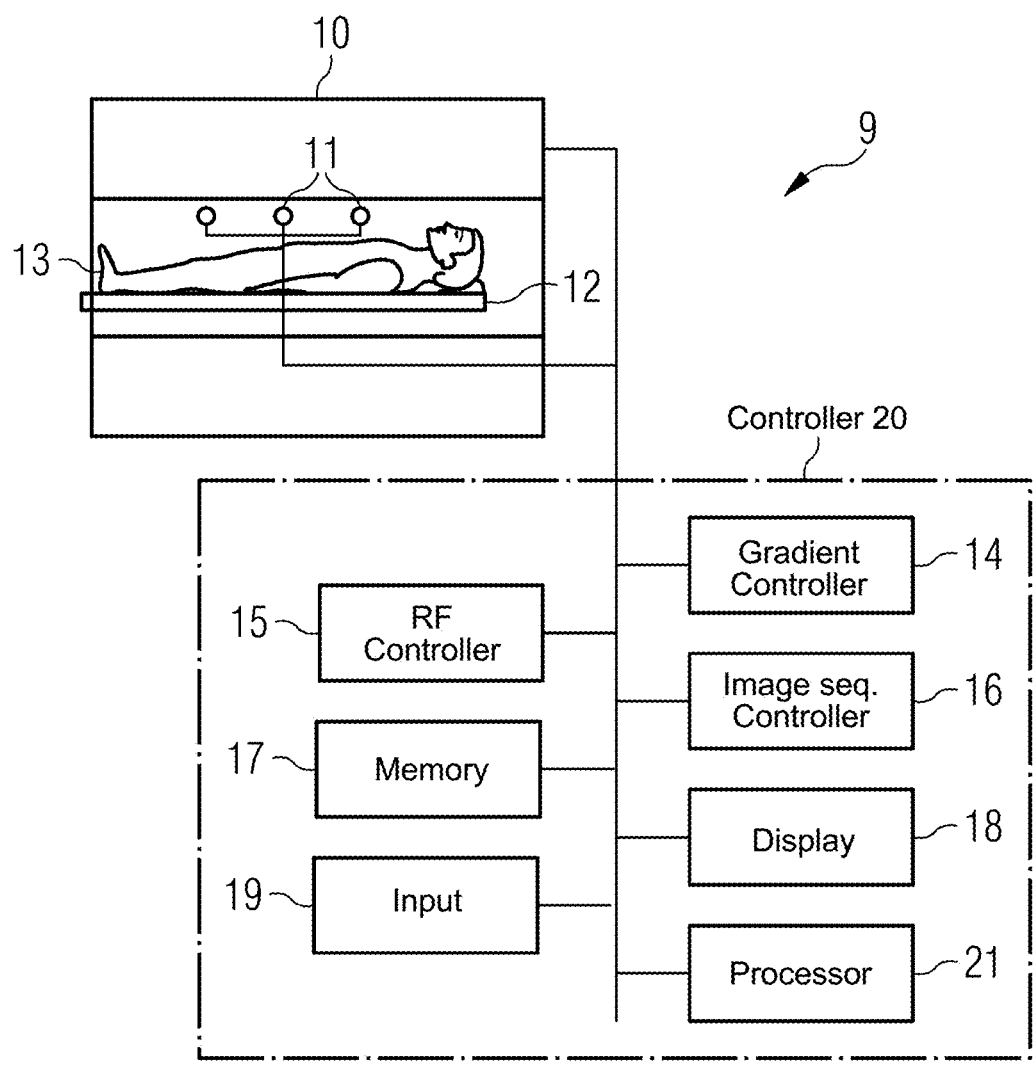
FIG. 10 shows a magnetic resonance (MR) system according to an exemplary embodiment of the disclosure configured to acquire and generate MR images.

FIG. 10 shows a schematic view of a MR system 9 configured to generate the MR images using constant radii corkscrew trajectories of different size. The MR system 9 comprises a magnet 10 generating a polarizing field BO. The object under examination 13 lying on a table 12 is moved into the center of the MR system 9 where MR signals can be detected after excitation using the receiving coils 11 wherein different coil sections or receiving coils may be used. By applying RF pulses and the magnetic field gradients, the nuclear spins in the object, especially the part located in the receiving coil are excited and the currents induced by the relaxation is detected. The way how MR images are generated and how the MR signals are detected using a sequence of RF pulses and the sequence of magnetic field gradients are known in the art so that a detailed explanation thereof can be omitted. Furthermore, details for the switching of magnetic field gradients were given above.

The MR system furthermore comprises a controller 20 which is used for a central control of the MR system. In an exemplary embodiment, the controller 20 comprises a gradient controller 14 configured to control and switch the magnetic field gradients. Furthermore, an RF controller 15 is provided configured to control and generate the RF pulses for the imaging sequences. An image sequence controller 16 is provided which controls the sequence of the applied RF pulses and magnetic field gradients based on the selected imaging sequence and which thus controls the gradient controller 14, the RF controller 15 and the receiving coils 11. In a memory 17, computer programs needed for operating the MR system and the imaging sequence is necessary for generating the MR images can be stored together with the generated MR images. The generated MR images may be displayed on a display 18 wherein an input unit 19 is provided used by a user for an interaction with the MR system 9. A control or processor 21 can coordinate the operation of the different functional units shown in FIG. 8. The processing or controller 20 can comprise one or more processors which can carry out instructions stored on a memory 17. The memory can include the program code to be executed by the processor 20 so as to implement the above-described functionality. Especially the image sequence controller 16 and the processor 21 can be especially configured to first of all acquire the k-space as discussed in connection with FIG. 3-5 wherein the compressed sensing technology for the reconstruction may be implemented by the processor 21, or in more general by the controller 20. In an exemplary embodiment, the controller 20 (and/or one or more components therein) includes processor circuitry that is configured to perform one or more functions and/or operations of the controller 20 (and/or respective functions of the component(s)).

With the above-described method is it is possible to reduce the scan time as less trajectories are needed for the position of the k-space compared to the situation discussed above in connection with FIGS. 1 and 2 where a constant radius was used. Accordingly, a higher acceleration is obtained. Furthermore, the above-proposed method fulfills the requirement of a compressed sensing with a sparse sampling and a high incoherence of the undersampled artefacts so that a higher acceleration is obtained by combining the WAVE-CAIPIRINHA method with compressed sensing.

Furthermore, by altering the frequency and the amplitude of the constant radii corkscrew trajectories the object under examination will no longer experience a constant pitch which may be experienced as more pleasant. In total, the altering of the radius leads to a higher incoherence of the sampled data which is especially beneficial in iterative reconstruction technologies.

To enable those skilled in the art to better understand the solution of the present disclosure, the technical solution in the embodiments of the present disclosure is described clearly and completely below in conjunction with the drawings in the embodiments of the present disclosure. Obviously, the embodiments described are only some, not all, of the embodiments of the present disclosure. All other embodiments obtained by those skilled in the art on the basis of the embodiments in the present disclosure without any creative effort should fall within the scope of protection of the present disclosure.

It should be noted that the terms "first", "second", etc. in the description, claims and abovementioned drawings of the present disclosure are used to distinguish between similar objects, but not necessarily used to describe a specific order or sequence. It should be understood that data used in this way can be interchanged as appropriate so that the embodiments of the present disclosure described here can be implemented in an order other than those shown or described here. In addition, the terms "comprise" and "have" and any variants thereof are intended to cover non-exclusive inclusion. For example, a process, method, system, product or equipment comprising a series of steps or modules or units is not necessarily limited to those steps or modules or units which are clearly listed, but may comprise other steps or modules or units which are not clearly listed or are intrinsic to such processes, methods, products or equipment.

References in the specification to "one embodiment," "an embodiment," "an exemplary embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The exemplary embodiments described herein are provided for illustrative purposes, and are not limiting. Other exemplary embodiments are possible, and modifications may be made to the exemplary embodiments. Therefore, the specification is not meant to limit the disclosure. Rather, the scope of the disclosure is defined only in accordance with the following claims and their equivalents.

Embodiments may be implemented in hardware (e.g., circuits), firmware, software, or any combination thereof. Embodiments may also be implemented as instructions stored on a machine-readable medium, which may be read and executed by one or more processors. A machine-readable medium may include any mechanism for storing or transmitting information in a form readable by a machine (e.g., a computer). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact results from computing devices, processors, controllers, or other devices executing the firmware, software, routines, instructions, etc. Further, any of the implementation variations may be carried out by a general-purpose computer.

For the purposes of this discussion, the term "processor circuitry" shall be understood to be circuit(s), processor(s), logic, or a combination thereof. A circuit includes an analog circuit, a digital circuit, state machine logic, data processing circuit, other structural electronic hardware, or a combination thereof. A processor includes a microprocessor, a digital signal processor (DSP), central processor (CPU), application-specific instruction set processor (ASIP), graphics and/or image processor, multi-core processor, or other hardware processor. The processor may be "hard-coded" with instructions to perform corresponding function(s) according to aspects described herein. Alternatively, the processor may access an internal and/or external memory to retrieve instructions stored in the memory, which when executed by the processor, perform the corresponding function(s) associated with the processor, and/or one or more functions and/or operations related to the operation of a component having the processor included therein.

In one or more of the exemplary embodiments described herein, the memory is any well-known volatile and/or non-volatile memory, including, for example, read-only memory (ROM), random access memory (RAM), flash memory, a magnetic storage media, an optical disc, erasable programmable read only memory (EPROM), and programmable read only memory (PROM). The memory can be non-removable, removable, or a combination of both.

The invention claimed is:

1. A method for generating at least one magnetic resonance (MR) image of an object in an MR system having a plurality of signal receiving coils, the method comprising:
    applying a sequence of radio frequency (RF) pulses to generate a plurality of MR signal-echoes;
    detecting the plurality of MR signal-echoes with the plurality of signal receiving coils in a 3-dimensional k-space that is undersampled with a plurality of constant radii corkscrew trajectories having different radii resulting in a non-homogeneous undersampled 3-dimensional k-space; and
    reconstructing the at least one MR image based on the non-homogeneous undersampled 3-dimensional k-space using a compressed sensing technology.

2. A magnetic resonance (MR) system configured to generate at least one MR image of an object under examination, the MR system comprising:
    a radio frequency (RF) controller configured to apply a sequence of RF pulses to generate a plurality of MR signal echoes;
    a gradient controller configured to generate magnetic field gradients;
    a plurality of signal receiving coils configured to detect MR signal echoes;
    an image sequence controller configured to control an application of RF pulses, magnetic field gradients, and detection of MR signal echoes in 3-dimensional k-space such that the 3-dimensional k-space is undersampled with a plurality of constant radii corkscrew trajectories having different radii resulting in a non-homogeneous undersampled 3-dimensional k-space; and
    a processor configured to reconstruct the at least one MR image based on the non-homogeneous undersampled 3-dimensional k-space using a compressed sensing technology.

3. The method according to claim 1, wherein the radii of the plurality of constant radii corkscrew trajectories increase with an increasing distance from a center of the non-homogeneous undersampled 3-dimensional k-space.

4. The method according to claim 1, wherein the plurality of MR signal-echoes of each of the plurality of constant radii corkscrew trajectories are detected in a first data sampling period that is the same for all of the plurality of constant radii corkscrew trajectories.

5. The method according to claim 4, wherein a sampling rate with which the plurality of MR signal-echoes are sampled within the first data sampling period is larger for a first constant radii corkscrew trajectory of the plurality of constant radii corkscrew trajectories having a larger radius compared to a sampling rate which with the plurality of MR signal-echoes are sampled within the first sampling period for a second constant radii corkscrew trajectory of the plurality of constant radii corkscrew trajectories having a smaller radius than the first constant radii corkscrew trajectory.

6. The method according to claim 4, wherein a sampling rate with which the plurality of MR signal-echoes are sampled within the first data sampling period is the same for all of the plurality of constant radii corkscrew trajectories, wherein a number of turns is smaller for a first constant radii corkscrew trajectory of the plurality of constant radii corkscrew trajectories having a larger radius compared to the number of turns for a second constant radii corkscrew trajectory of the plurality of constant radii corkscrew trajectories having a smaller radius than the first constant radii corkscrew trajectory.

7. The method according to claim 1, wherein the non-homogenous undersampled 3-dimensional k-space is k-space which is incompletely sampled under a Nyquist theorem.

8. A non-transitory computer program product which includes a program and is directly loadable into a memory of the MR system, when executed by a processor of the MR system, causes the processor to perform the method as claimed in claim 1.

9. A non-transitory computer-readable storage medium with an executable program stored thereon, that when executed, instructs a processor to perform the method of claim 1.

10. The MR system according to claim 2, wherein the image sequence controller is configured to sample the non-homogeneous undersampled 3-dimensional k-space such that the radii of the plurality of constant radii corkscrew trajectories increase with an increasing distance from a center of the non-homogeneous undersampled 3-dimensional k-space.

11. The MR system according to claim 2, wherein the image sequence controller is configured to detect the MR signal-echoes of each of the plurality of constant radii corkscrew trajectories in a first data sampling period which is the same for all of the plurality of constant radii corkscrew trajectories.

12. The MR system according to claim 11, wherein the image sequence controller is configured to use a sampling rate with which the MR signal-echoes are sampled within the first data sampling period that is larger for a first one of the plurality of constant radii corkscrew trajectories having a larger radius compared to the sampling rate with which the MR signal-echoes are sampled within the first sampling period for a second one of the plurality of constant radii corkscrew trajectories having a smaller radius than the first one of the plurality of constant radii corkscrew trajectories.

13. The MR system according to claim 11, wherein the image sequence controller is configured to use a sampling rate with which the MR signal-echoes are sampled within the first data sampling period that is the same for all of the plurality of constant radii corkscrew trajectories, wherein a number of turns is smaller for a first constant radii corkscrew trajectory of the plurality of constant radii corkscrew trajectories having a larger radius compared to the number of turns for a second constant radii corkscrew trajectory of the plurality of constant radii corkscrew trajectories having a smaller radius than the first constant radii corkscrew trajectory.

* * * * *